United States Patent [19]
Glenn

[11] Patent Number: 5,948,175
[45] Date of Patent: Sep. 7, 1999

[54] STRAP DEVICE CLAMPING SOLDERED WIRES FOR USE IN SOLAR CELL ARRAYS

[75] Inventor: Gregory S. Glenn, Pacific Palisades, Calif.

[73] Assignee: Hughes Electronics Corporation, El Segundo, Calif.

[21] Appl. No.: 08/764,802

[22] Filed: Dec. 12, 1996

[51] Int. Cl.[6] .................................................. H01L 31/05
[52] U.S. Cl. .................... 136/244; 228/179.1; 228/180.5
[58] Field of Search ..................................... 136/244, 256; 228/179.1, 210, 212, 180.5, 173.1, 173.6, 135, 139; 439/459, 462; 438/83

[56] References Cited

U.S. PATENT DOCUMENTS

| | | | |
|---|---|---|---|
| 3,620,847 | 11/1971 | Wise | 136/89 |
| 3,972,463 | 8/1976 | Conlon et al. | 228/44.1 A |
| 4,314,095 | 2/1982 | Moore . | |
| 4,943,687 | 7/1990 | Armbuster et al. | 174/94 R |
| 4,966,565 | 10/1990 | Dohi | 439/874 |
| 5,097,100 | 3/1992 | Jackson . | |
| 5,541,380 | 7/1996 | Ogden et al. | 219/56 |
| 5,609,491 | 3/1997 | Cooper et al. | 439/79 |

FOREIGN PATENT DOCUMENTS

| | | |
|---|---|---|
| 0773600 | 5/1997 | European Pat. Off. . |
| 0490 723 A1 | 6/1992 | France ............................. H05B 3/86 |
| 36 29 864 A1 | 3/1987 | Germany ........................ B23K 37/04 |
| 3629864A1 | 3/1987 | Germany . |
| 90166664 | 2/1991 | Germany . |
| 09082378 | 8/1997 | Japan . |

*Primary Examiner*—Nam Nguyen
*Assistant Examiner*—Michael C. Miggins
*Attorney, Agent, or Firm*—V. D. Duraiswamy; M. W. Sales

[57] ABSTRACT

A strap device clamps soldered wires to a conductive pad to reduce stress on the solder joints and to prevent the wire from springing off of the conductive pad if the solder joint should fail. This is accomplished by forming a conductive strap on a die into a yoke shape. The ends of the strap are then welded to a conductive pad so that the strap's yoke shape defines an opening between the strap and the conductive pad. A wire is inserted into the opening and soldered to form a solder joint between the wire, the strap, and the conductive pad. The strap reduces the stress on the solder joint by increasing its surface area and by clamping the wire to the conductive pad during the high temperature portion of a thermal cycle. If the solder joint should fail, the conductive strap maintains a electro-mechanical connection between the wire and the conductive pad.

4 Claims, 2 Drawing Sheets

STRAP DEVICE CLAMPING SOLDERED WIRES FOR USE IN SOLAR CELL ARRAYS

BACKGROUND OF THE INVENTION

1. Field of the Invention

This invention relates to solder joints that electro-mechanically connect wires and conductive pads and more specifically to a strap device and method for clamping soldered wires to improve the reliability of solder joints.

2. Description of the Related Art

Soldered wires are commonly used to provide electrical interconnections. In general, the stranded or solid wire is soldered flat to a conductive pad on a substrate. For example, in solar arrays, soldered wires are used to connect the series connected solar cell strings in series or parallel. The solar cell strings and their end termination tabs are mounted on a solar panel and the soldered wires are spot bonded to the panel to hold them down. Soldered wires are also used to connect the circuity on a printed circuit (PC) board to external circuitry. The soldered wires are terminated at a power bus on the PC board. In both of these cases, there is typically a substantial mismatch between the thermal coefficients of expansion (TCE) for the conductive pad (end termination tab or power bus) and the substrate (solar panel or PC board). Furthermore, there is also a mismatch between the solder and the copper wire/conductive pad.

When the soldered wires are subjected to extreme temperature cycling, such as found in satellites, the solder joints will become fatigued over time. A satellite in geo-synchronous orbit may, for example, cycle between −180° C. and +80° C. for 1600 cycles and in low earth orbit may cycle between −80° C. to +100° C. for 30,000 cycles. The TCE mismatch causes the substrate, conductive pad, solder and wire to expand and contract at different rates. This produces mechanical stress on the solder joint. Furthermore, at the high temperature end of the thermal cycle, the solder will soften and the flexing wire will try to pull up and off of the conductive pad. As the solder joint becomes fatigued it becomes more susceptible to cracking and eventually springing off the pad thereby breaking both the mechanical and electrical connections.

To reduce the stress on the solder joints, the wires are typically bent into an S-shape between two solder joints on the surface of the substrate. As a result, the force exerted on the solder joints as the wire expands and contracts is reduced. Although this improves the reliability of the solder joint, it may still fail.

Where reliability specifications require a redundant mechanical attachment in case the solder joint should fail, a pull-tab is cut into the conductive pad, punched to form a hole in the pull-tab, and bent upwards. The wire is inserted into the hole and soldered. If the solder joint fails, the pull-tab is supposed to maintain the mechanical and electrical connection to the wire. However, cutting the pull-tab out of the conductive pad weakens the pad itself. Furthermore, the pull-tab is prone to tearing along its bottom edge where it is connected to the conductive pad. Lastly, the solder joint around the circumference of the wire is only as thick as the pull-tab. Because the pull-tab is typically very thin, approximately 0.05 cm, the solder joint is relatively weak.

SUMMARY OF THE INVENTION

In view of the above problems, the present invention provides a strap device and method for clamping soldered wires to reduce stress on the solder joints and for preventing the wire from springing off of the conductive pad if the solder joint should fail.

This is accomplished by forming a conductive strap on a die into a yoke shape. The ends of the strap are then welded to a conductive pad such that the strap's yoke shape defines an opening between the strap and the conductive pad. A wire is inserted into the opening and soldered to form a solder joint between the wire, the strap, and the conductive pad. The strap reduces the stress on the solder joint by increasing its surface area and by clamping the wire to the conductive pad during the high temperature portion of a thermal cycle. If the solder joint should fail, the conductive strap maintains the electro-mechanical connection between the wire and the conductive pad.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
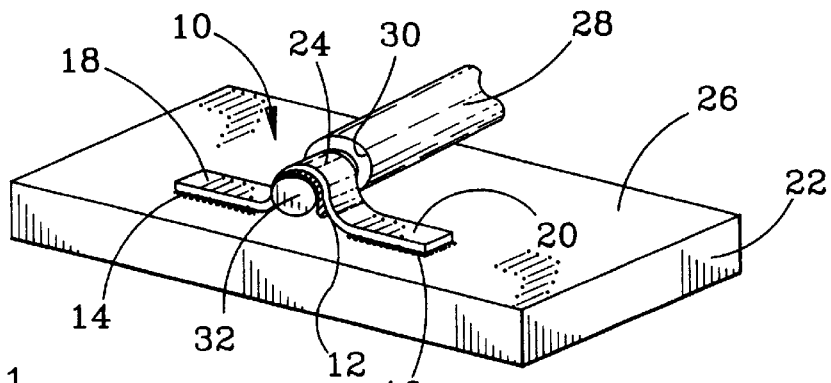
FIG. 1 is a perspective view of a strap device for a soldered wire in accordance with the present invention.

In accordance with the present invention, a conductive strap 10 is used to reduce stress on a solder joint 12 and, in case the solder joint 12 should still fail, to provide a mechanical attachment that maintains the mechanical and electrical connections as shown in FIG. 1. A pair of weld joints 14 and 16 attach the respective ends 18 and 20 of the strap 10 to a conductive pad 22. The conductive pad 22 may be, for example, an end termination tab, a power bus or a discrete part for repairing broken soldered wires. A yoke-shaped portion 24 of the strap 10 defines an opening between the strap and the conductive surface 26 of the pad 22. A wire 28, either stranded or solid, is stripped of its cladding 30 to expose its leads 32 and inserted through the opening. The wire leads 32, strap 10 and conductive pad 22 are soldered together to form the solder joint 12.

The strap 10 improves the reliability of the electro-mechanical connection in several ways. First, the solder joint 12 is strengthened by increasing its surface area. Unlike the known pull-tab, the width of the solder joint is not restricted to the thickness of the conductive pad, which is typically very thin. The strap's width can be selected to provide a wider, and thus stronger, solder joint. For example, if the conductive pad 22 is 0.05 cm thick the strap 10 is suitably 0.15 cm wide, or three times the pad's thickness. Furthermore, the solder joint extends around the circumference of the wire lead 32. Second, the strap 10 physically clamps the wire 28 against the board during the high temperature portion of the cycle when the solder is weakest. This prevents the wire 28 from pulling up on the solder joint thereby reducing the stress on the solder joint. Lastly, should the solder joint 12 fail, the strap 10 will maintain an adequate electro-mechanical connection to the conductive pad 22. Because the strap 10 is welded to the conductive pad 22 it is stronger than the known pull-tab method, and thus is less susceptible to being torn off of the pad. The improved reliability realized by clamping the soldered wires is particularly important in satellite applications where the solder joints undergo extreme temperature cycles over the lifetime of the satellite and cannot be repaired.

FIGS. 2a through 2d illustrate the process of forming the strap 10 to clamp the wire 28 to the conductive pad 22. The strap 10 is a conductive material such as silver, silver plated copper, molybdenum, kovar or invar. Plated copper and plated molybdenum are used in applications that are highly sensitive to magnetic fields. Plated kovar and plated invar are relatively inexpensive and can withstand high thermal stresses. Pure silver is the easiest to weld but can withstand only relatively low thermal stresses. The strap preferably has a TCE close to the conductive pad's TCE, and oftentimes will be formed from the same material. For a particular end termination tab, the strap is suitably 0.5 cm in length, 0.615 cm wide, and 0.005 cm thick when formed. These dimensions will vary depending on wire diameter and the required strength of the solder joint for a given application.

Figure 2A:
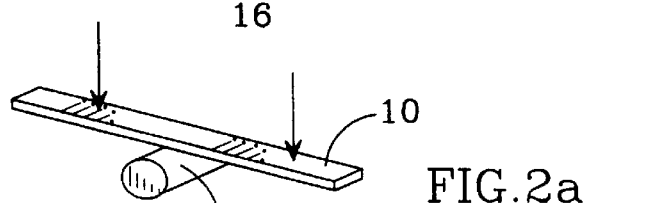
FIGS. 2a through 2d illustrate the process for forming the clamp device shown in FIG. 1.
Figure 2B:
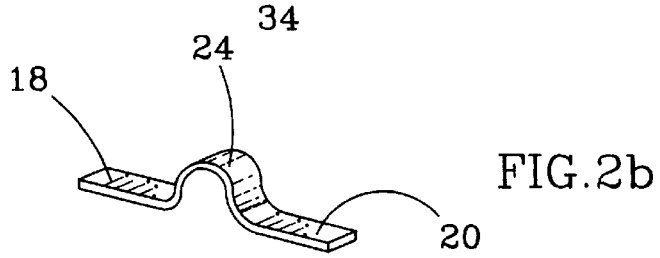

As illustrated in FIG. 2a, the strap 10 is formed around a die 34 to give the strap its yoke shape as shown in FIG. 2b. The die preferably has a half oval or circular shape such that the formed strap has smoothed, and thus stronger, sides. The die has a diameter that is slightly larger than the diameter of the wire so that the wire can be inserted into the opening defined by the strap.

Figure 2C:
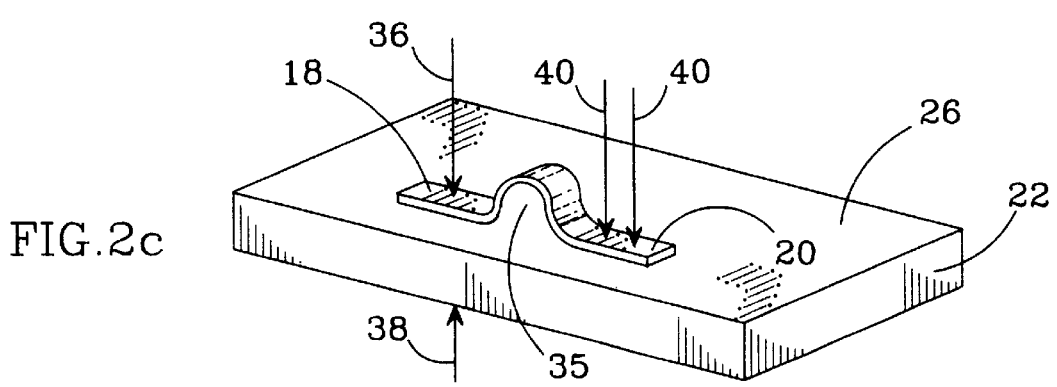

As shown in FIG. 2c, the strap 10 is placed on the conductive pad 22 and its ends 18 and 20 are welded to the surface 26 of the pad to define an opening 35. For purposes of illustration, the end 18 is shown with a pincher weld and end 20 is illustrated with a parallel gap weld. In practice, one of the two welding methods is selected. A pincher weld is performed by placing a first electrode 36 on top of the strap 10 and a second electrode 38 underneath the conductive pad 22 opposite the first electrode. A force of 15–20 lbs is exerted on the electrodes while current is driven through them to produce heat. The combination of heat and pressure produce the weld joint 14. A parallel gap weld is performed by placing a pair of electrodes 40 on top of the strap 10 and exerting pressure on the electrodes while forcing current through them to produce the weld joint 16. Each end of the strap is suitably provided with a pair of weld joints. A pincher weld requires four steps to weld both ends of the strap 10 while a parallel gap weld requires only two steps.

Figure 2D:
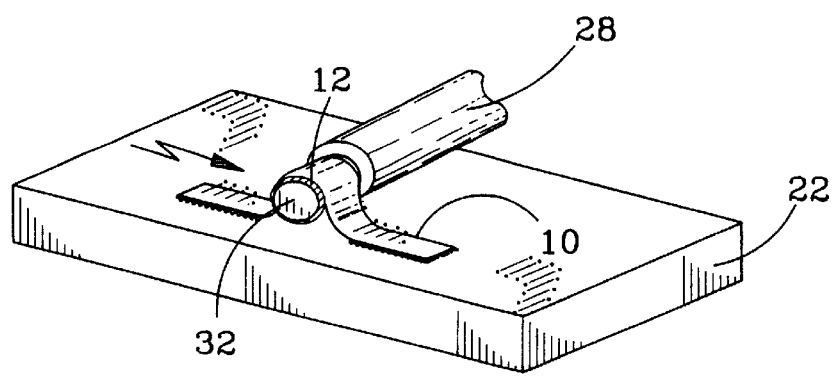

As shown in FIG. 2d, the wire's copper leads 32 are preferably tinned and then inserted into the opening 35. Solder is placed around the wire leads 32 and heated to form the solder joint 12 around the circumference of the wire. The solder joint 12 electro-mechanically connects the leads 32, the strap 10, and the conductive pad 22. In many applications, once the strap is welded to the conductive pad, the conductive pad is mounted on a substrate prior to forming the soldered wire connection. In some cases, such as a PC board, the conductive pad (power bus) is integrally formed with the substrate.

Figure 3:
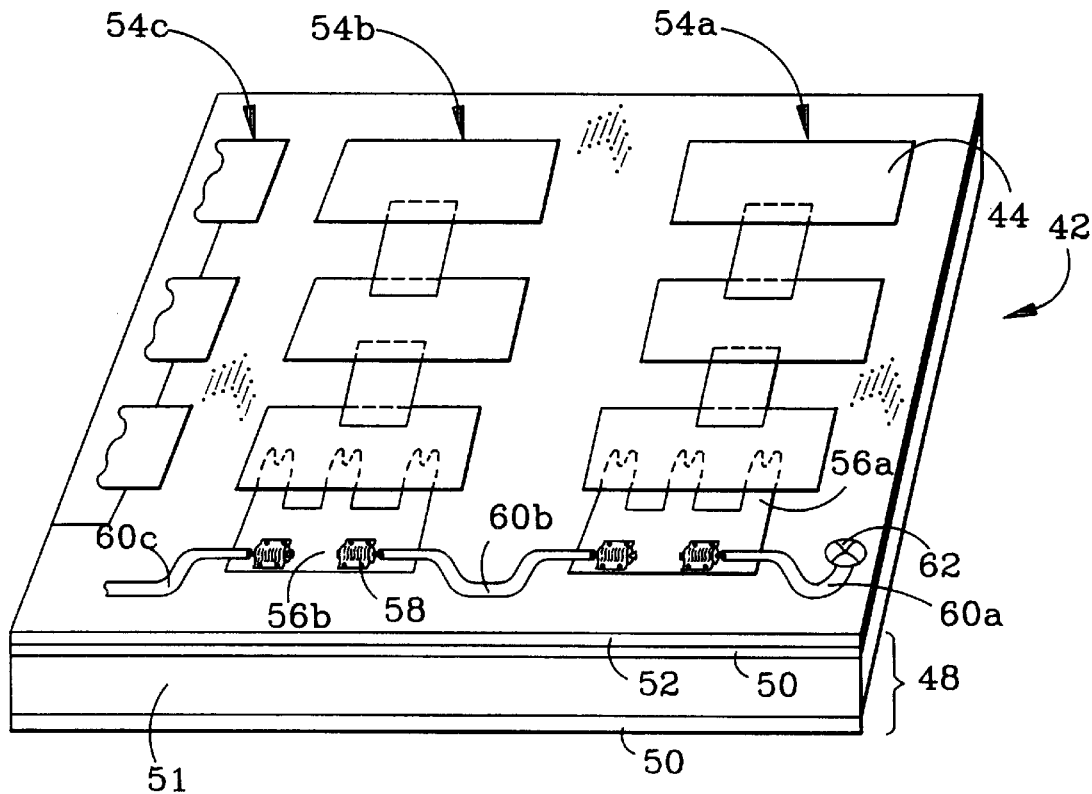
FIG. 3 is a perspective view of a solar array that uses the strap device to clamp the soldered wire connections between the solar cell strings.

As shown in FIG. 3, a satellite solar array 42 uses the strap device of the present invention to clamp its soldered wires. The solar array 42 includes a plurality of solar cells 44 that are connected in series to produce a desired voltage and in series or parallel to produce a final desired circuit voltage and current, and mounted on a solar panel substrate 48 that provides a rigid support structure with sufficient axial and bending stiffness for carrying the solar cells through a dynamic launch environment into orbit and positioning them to receive illumination. The substrate 48 is suitably formed by bonding a pair of thin facesheets 50, suitably Kevlar®, graphite or aluminum, onto opposite sides of an aluminum honeycomb core 51. If the material used in the facesheets 50 is conductive, an insulation layer 52 is formed over the top facesheet to electrically isolate the solar cells 44. The combination of the honeycomb core with the stiff facesheets provides a lightweight yet strong substrate 48. The TCEs of graphite and Kevlar® are much lower than the TCEs of the end termination tab and strap. In fact graphite has a negative TCE such that it expands when cooled and contracts when heated, which produces stress on the solar array's soldered wires.

The strings 54a, 54b, . . . 54n of series connected solar cells are connected in series or parallel by terminating them with respective end termination tabs 56a, 56b, . . . 56n and then connecting the tabs using clamped soldered wires. A plurality, typically a pair, of yoke shaped straps 58 are welded to each of the termination tabs 56a, 56b, . . . 56n to define respective openings. At one end of the solar array, a wire 60a is fed through a hole 62 in the substrate 48 and is terminated on a terminal board (not shown), typically ground reference potential or the supply voltage. The other end of wire 60a is inserted into the opening defined by the first strap 58 on end termination tab 56a and soldered to electro-mechanically connect the end termination tab, the strap, and the wire. The ends of wire 60b are inserted into the openings defined by the second strap 58 and first strap 58 on end termination tab 56a and 56b, respectively, and soldered to connect one end of strings 54a and 54b in series or parallel. This is repeated for each of the n end termination tabs until the last wire is terminated to the reference terminal. The other end of the strings 54a, 54b, . . . 54n are similarly terminated to complete the series/parallel connection of the solar cells 44.

Figure 4A:
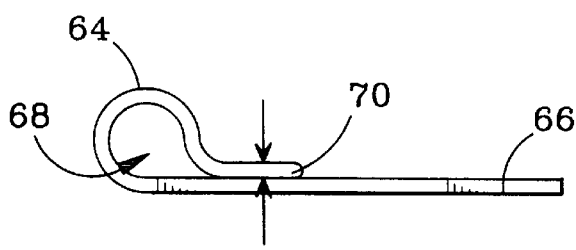
FIGS. 4a and 4b are sectional views of different embodiments of a strap device that is integrally formed with the end termination tab.
Figure 4B:
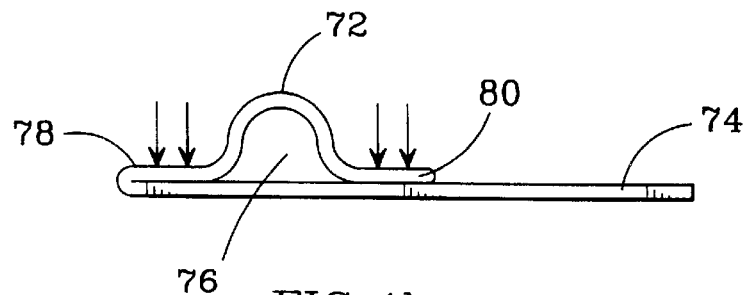

Instead of providing the strap as a discrete component that is independently formed and then welded to the conductive pad, the strap can be integrally formed with the conductive pad, rolled on a die to define the opening, and then welded to the surface of the conductive pad. As shown in FIG. 4a, a strap 64, integrally formed with a conductive pad 66, has been formed over a die to define an opening 68 between the strap 64 and the conductive pad 66 and to have an exterior end 70 that is welded to the conductive pad 66. As shown in FIG. 4b, a strap 72, integrally formed with a conductive pad 74, has been formed over a die to define an opening 76 between the strap 72 and the conductive pad 74 and to have interior and exterior ends 78 and 80 that are welded to the conductive pad 74. The weld can be performed using either a pincher weld as shown in FIG. 4a or the parallel gap weld shown in FIG. 4b.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A solar array, comprising:
  a solar panel;
  a facesheet on said solar panel;
  a plurality of series connected solar cell strings on said facesheet;

a plurality of end termination tabs on said facesheet that are connected to the respective solar cell strings;

a plurality of yoke shaped straps that are welded to respective end termination tabs, said straps each having (a) first and second ends welded to its respective end termination tab and (b) an intermediate arch connecting said ends, said arch bridging an opening between said arch and said end termination tab;

a plurality of wires having first and second ends that extend through different openings on different end termination tabs with the arch of each strap extending over its respective wire to connect the strings in parallel; and a plurality of solder joints that connect the end termination tab, the strap and the wire at the openings, respectively.

2. The solar array of claim 1, wherein said first end of said strap is integrally formed with said end termination tab and said second end of said strap is welded to said end termination tab to define the opening.

3. The solar array of claim 1, wherein said end termination tab and said strap are formed from respective electrically conductive materials having thermal coefficients of expansion that are sufficiently similar to prevent mechanical failure during temperature variations between −80 and +100 degrees Centigrade.

4. The solar array of claim 3, wherein said end termination tab and said strap are formed from the same electrically conductive materials.

* * * * *